United States Patent [19]

Lin et al.

[11] Patent Number: 5,171,703

[45] Date of Patent: Dec. 15, 1992

[54] DEVICE AND SUBSTRATE ORIENTATION FOR DEFECT REDUCTION AND TRANSISTOR LENGTH AND WIDTH INCREASE

[75] Inventors: Yi-Ching Lin, Sunnyvale; Haiping Dun, Fremont; Ragupathy V. Giridhar, San Jose, all of Calif.

[73] Assignee: Intel Corporation, Santa Clara, Calif.

[21] Appl. No.: 749,210

[22] Filed: Aug. 23, 1991

[51] Int. Cl.$^5$ .............................. H01L 21/72
[52] U.S. Cl. ........................... 437/61; 437/946; 148/DIG. 115
[58] Field of Search .............. 437/48, 51, 61, 93, 437/924, 946, 970; 148/33, 33.2, DIG. 102, DIG. 115

[56] References Cited

U.S. PATENT DOCUMENTS

| | | | |
|---|---|---|---|
| 3,643,137 | 2/1972 | Ono et al. | 148/33 |
| 3,659,160 | 4/1972 | Sloan, Jr. et al. | 148/DIG. 115 |
| 3,785,886 | 1/1974 | Castrucci et al. | 148/DIG. 115 |
| 3,798,513 | 3/1974 | Ono | 148/DIG. 115 |
| 4,662,059 | 5/1987 | Smeltzer et al. | 148/DIG. 115 |

FOREIGN PATENT DOCUMENTS 0128469 5/1989 Japan .................. 437/946

OTHER PUBLICATIONS

Bean, et al.; "The Influence of Crystal Orientation on Silicon Semiconductor Processing"; *Proceedings of the IEEE*; vol. 57; No. 9; 1969; pp. 1469-1476.
Claeys, et al.; "Defect Control in Si$_3$N$_4$/SiO$_2$ Structures for Isolation Techniques"; *VLSI Science and Technology*-1984; Proceedings vol. 84-7; Electrochemical Society; 1984; pp. 272-287.
Colclaser; *Microelectronics: Processing and Device Design*; 1980; pp. 53-72.
Sze; *VLSI Technology*; 1983; pp. 9-50.

*Primary Examiner*—Brian E. Hearn
*Assistant Examiner*—C. Chaudhari
*Attorney, Agent, or Firm*—Blakely, Sokoloff, Taylor & Zafman

[57] ABSTRACT

Methods of forming a semiconductor substrate and a device oriented substantially along a crystal direction other than a crystal direction that falls along a cleavage plane and the substrate and device formed by each method are disclosed. An ingot of monocrystalline material is formed and marked to denote a crystal direction other than a crystal direction that falls along a cleavage plane. The ingot is lapped to form a semiconductor substrate having a mark denoting a crystal direction other than a crystal direction that falls along a cleavage plane. A device is formed on the semiconductor substrate having a monocrystalline layer, such that a field oxide-active area edge or a gate electrode lies substantially along a crystal direction other than a crystal direction that falls along a cleavage plane. The present invention may be used on any device where dislocation defects, a lateral diffusion, or a lateral oxidation is to be minimized.

12 Claims, 6 Drawing Sheets

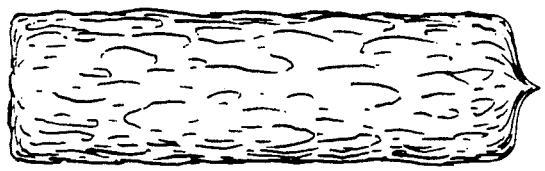
FIG_1
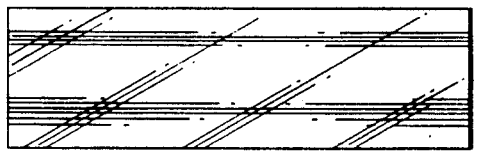
FIG_2A
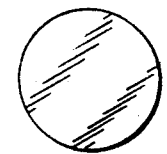
FIG_2B
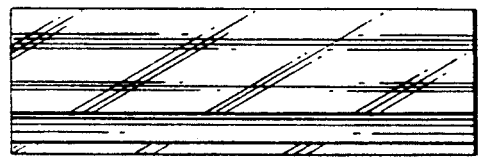
FIG_3A
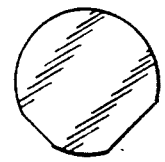
FIG_3B
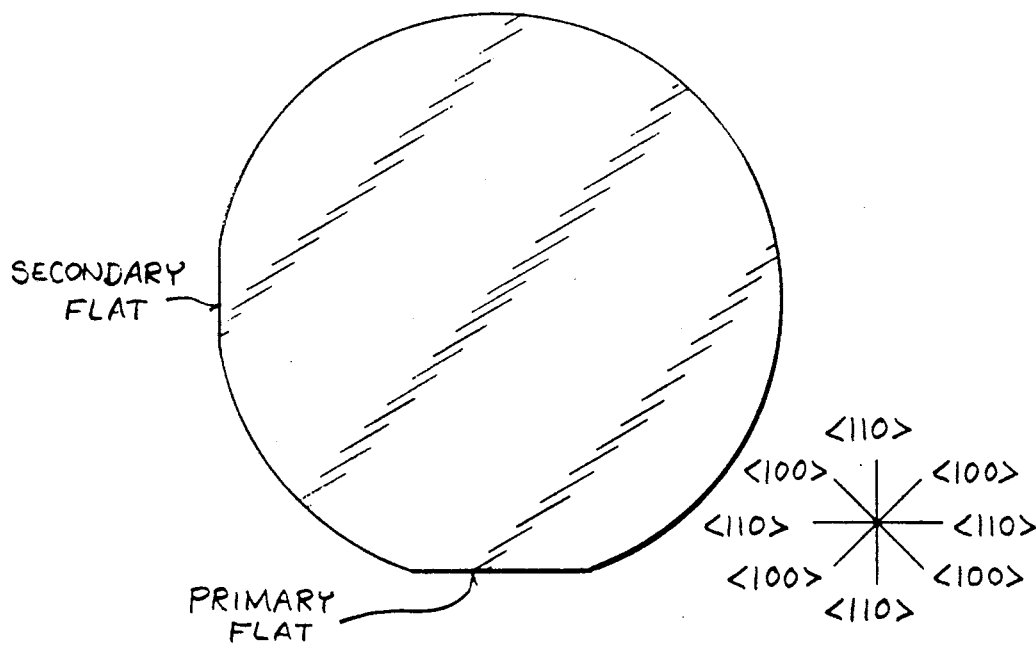
FIG_4 (PRIOR ART)

FIG_5
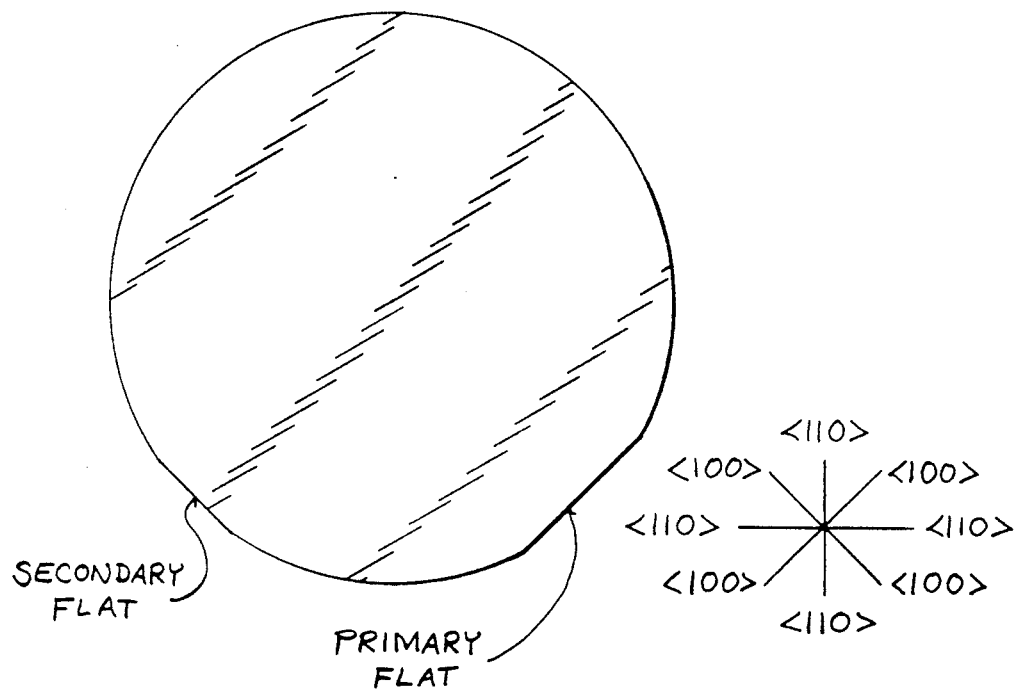
SECONDARY FLAT
PRIMARY FLAT
FIG_6
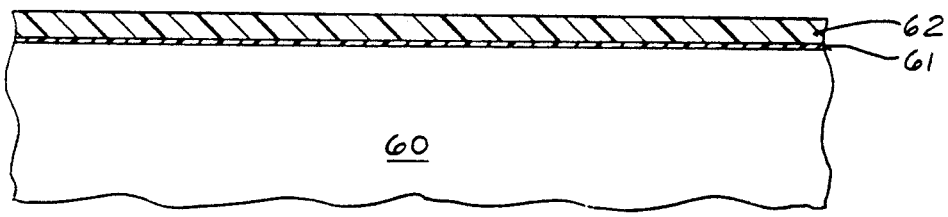
FIG_7
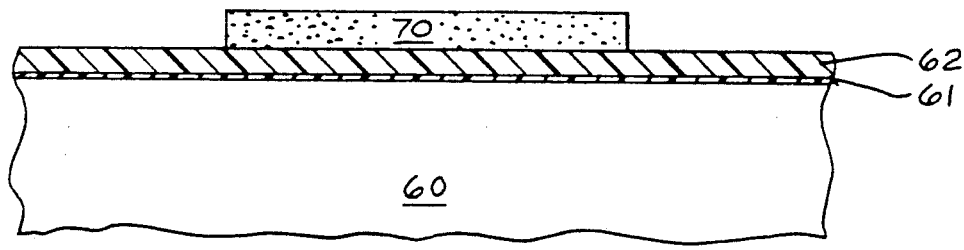

FIG_8
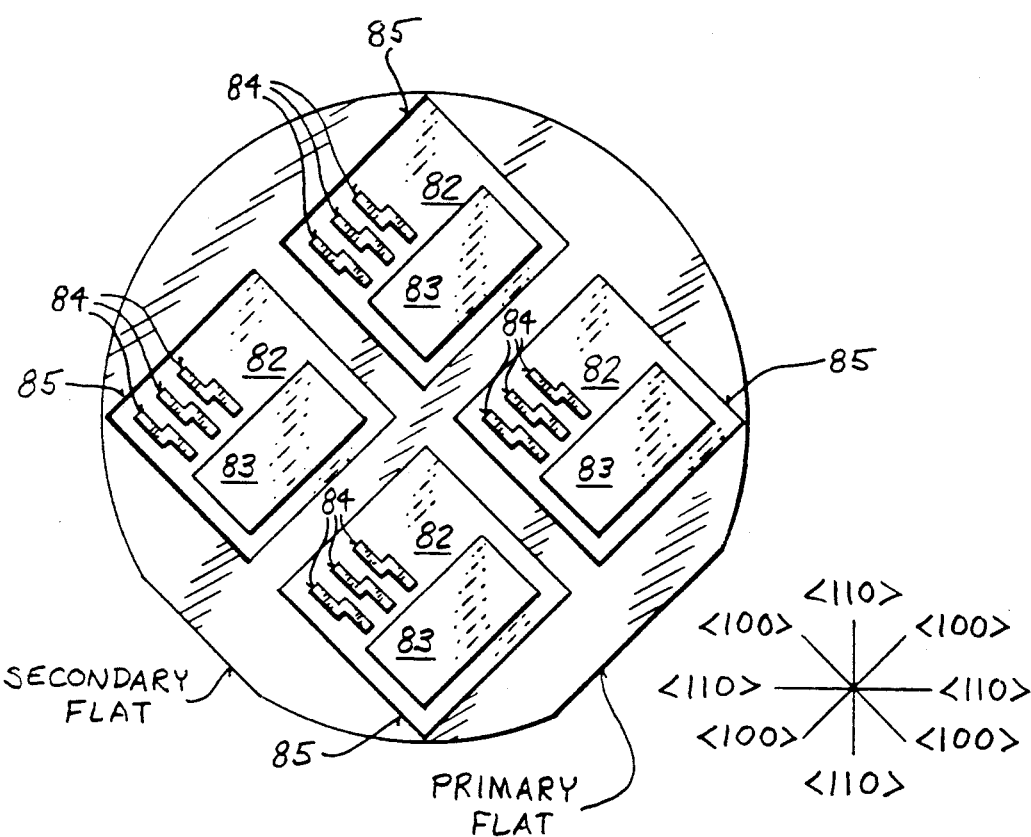
FIG_9
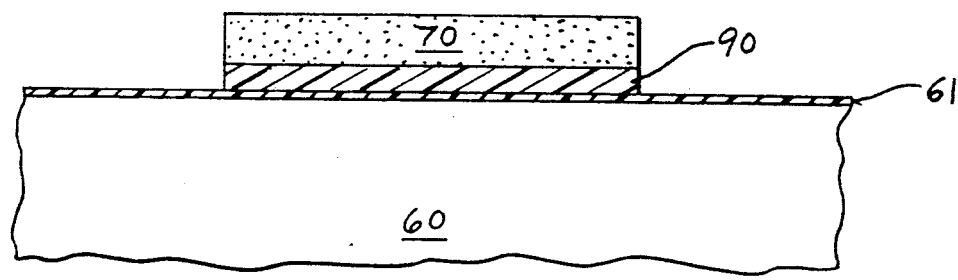

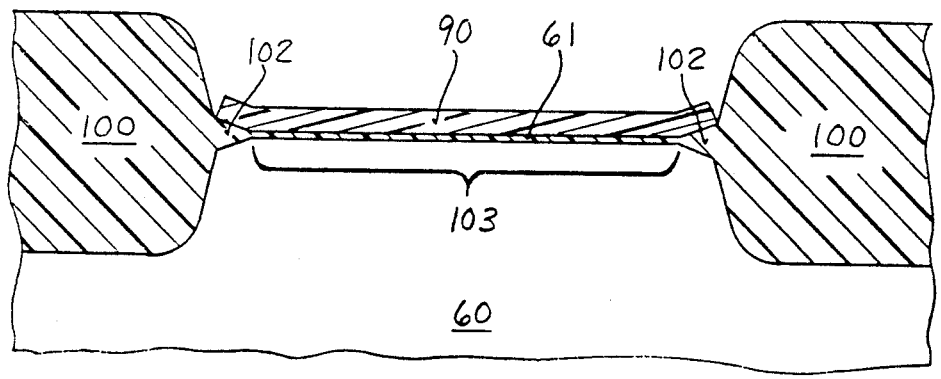
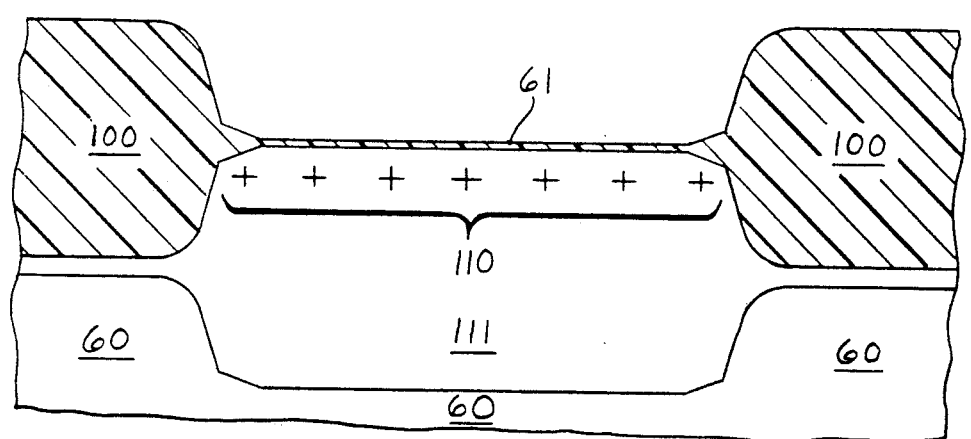
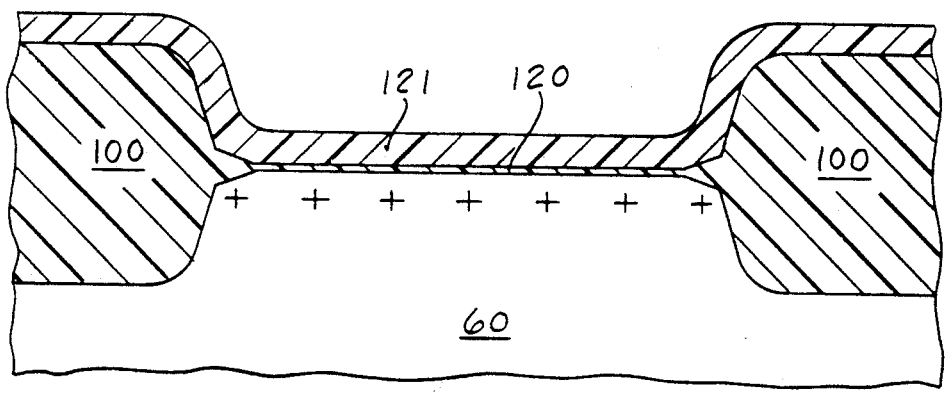

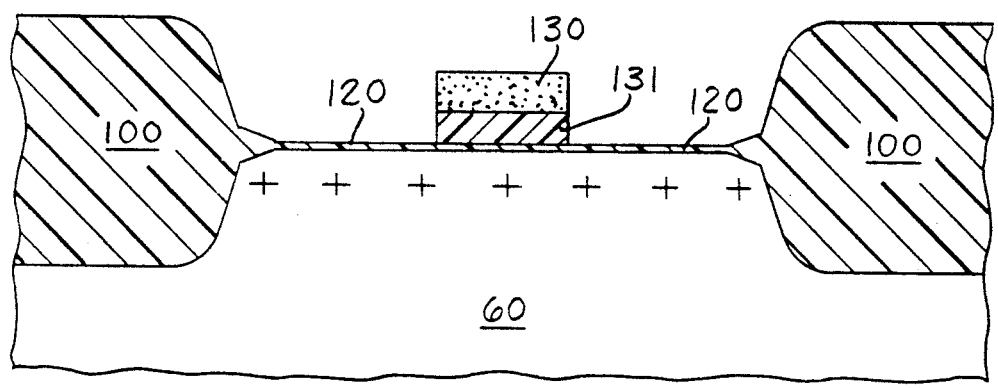
FIG_13
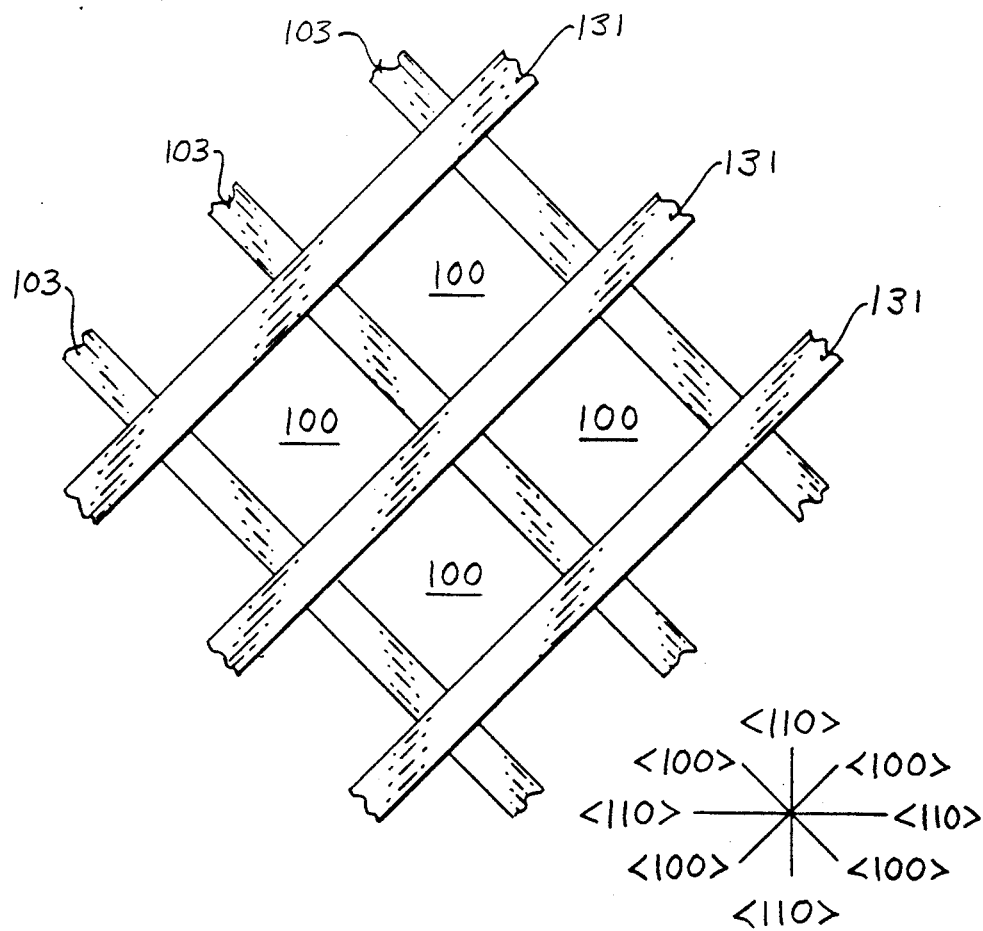
FIG_14

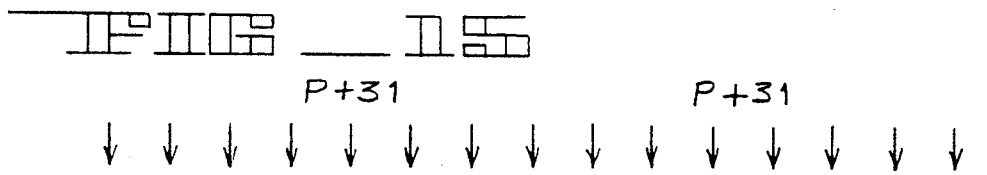
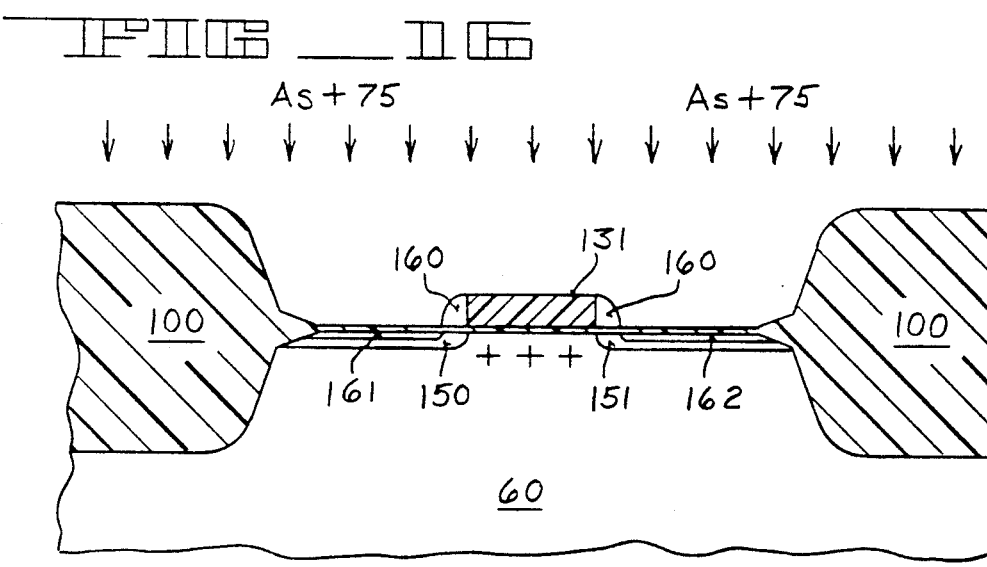
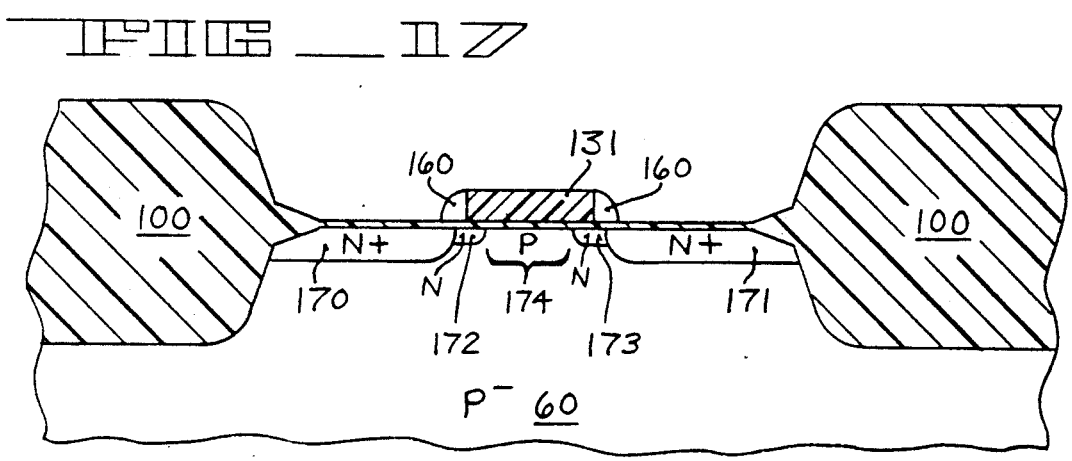

DEVICE AND SUBSTRATE ORIENTATION FOR DEFECT REDUCTION AND TRANSISTOR LENGTH AND WIDTH INCREASE

FIELD OF THE INVENTION

The present invention relates to the field of semicondutor devices and substrates, and in particular, to a device fabricated on a monocrystalline semiconductor substrate such that the device is oriented in any direction other than along cleavage planes.

BACKGROUND OF THE INVENTION

Semiconductor devices have traditionally been fabricated on a monocrystalline silicon layer. The manufacture and orientation of semiconductor crystals is well known in the art and is discussed in many articles and books including *Microelectronics Processing and Device Design* by Colclaser and *VLSI Technology* edited by Sze which are herein incorporated by reference and referred to as Colclaser and Sze, respectively. A silicon crystal has a basic tetrahedral structure that forms a diamond lattice. A silicon crystal ingot is formed from a seed crystal such that when the ingot is formed and subsequently lapped into wafers. A wafer's exposed surface, which will be used to subsequently form devices, lies generally along a (100) crystal plane, (110) crystal plane, or (111) crystal plane. Many metal oxide semiconductor (MOS) devices are made from wafers having an exposed (100) crystal plane. The (100) family of crystal planes consists of the (100), (010), (001), ($\bar{1}$00), ($0\bar{1}0$), and ($00\bar{1}$) crystal planes and are all equivalent planes which are hereinafter referred to as the (100) crystal planes. A bar over a "1" indicates a negative number. Perpendicular to each of the (100) crystal planes are directions including <100>, <010>, <001>, <$\bar{1}$00>, <$0\bar{1}0$>, and <$00\bar{1}$> and hereinafter are referred to as the <100> crystal directions. Similarly, there are the (110) and (111) families of crystal planes with their corresponding crystal directions that are herein referred to as the <110> crystal directions and the <111> crystal directions, respectively.

Many monocrystalline silicon wafers have an exposed surface generally lying along a (100) crystal plane and are herein referred to as (100) wafers. During formation of a wafer, at least one flat is typically formed along the edge of the wafer. The wafer may have more than one flat as shown in FIG. 24 on page 35 of Sze. If there is more than one flat, the longest flat is generally referred to as the primary flat. Within the semiconductor industry, the primary flat typically lies along a <110> crystal direction for (100) wafers. Cleavage planes for (100) wafers fall along the <110> crystal directions of the (100) crystal plane. The significance of the cleavage planes is discussed below.

A (100) wafer is subjected to a number of processing steps used to form devices within the wafer. During the fabrication of the devices, the first masking layer is typically aligned to the primary flat. The devices are usually rectangular and have rectilinear circuit patterns to keep wasted area to a minimum. Therefore, the borders of the devices and a significant fraction of the edges of the circuit patterns typically lie along the <110> crystal directions (cleavage planes). The wafer including finished devices is subjected to various packaging steps that take the devices from wafer form and put the device into individual packages. One of the operations during this packaging sequence is the sawing of the wafer into the individual devices. The prior art places the borders of the devices along the cleavage planes because the wafer breaks easier along the cleavage planes compared to directions other than along the cleavage planes which is why prior art devices are oriented primarily along the cleavage planes.

Crystal lattices may have three types of crystal defects: point defects, dislocation defects (also called line defects), and planar defects. The formation of a field oxide layer typically exerts a great amount of stress on the crystal lattice at field oxide-active area edges. For prior art devices, the field oxide-active area edges typically fall along the <110> crystal directions (cleavage planes) because the rectilinear circuits patterns are aligned to the primary flat, which falls along a cleavage plane. Therefore, dislocation defects along the field oxide-active area edges easily form during a field oxidation step because the prior art methods orient the field oxide-active area edges along the cleavage planes.

During the fabrication of metal oxide semiconductor devices, a gate electrode, which is typically comprised of polycrystalline silicon, is typically perpendicular to the field oxide-active area edge. Therefore, the gate electrodes generally are oriented along the cleavage planes, too. Device parameters include transistor length, which is the distance between the source tip region and drain tip region under the gate electrode, and transistor width, which is perpendicular to the transistor length. The transistor length is also called the effective channel length. A gate electrode that crosses an active area may be narrow enough such that the dislocation defect is longer than the transistor length thereby forming a "leaky" device. The device is considered leaky if the drain current is above a predetermined amount, such as 100 nA, when the source and gate are grounded and the drain is at a potential of about 5 V. The actual drain current used to determine whether or not a device is leaky varies according to the circuit design and density and varies according to one's circuit specifications.

State of the art devices within the semiconductor industry are currently fabricated using technologies having their smallest patterned dimension of about 0.8 μm. Future generations of devices are currently being designed with patterned dimensions of about 0.6 μm and smaller. The length of a dislocation defect along a cleavage plane needed to form a leaky device is its smallest when the field oxide-active area edge and the gate electrode are oriented primarily along the cleavage planes. The prior art method of orienting devices primarily along the cleavage planes has a greater likelihood of forming a 0.6 μm device with a dislocation-related leakage failure than a 0.6 μm device formed in accordance with the present invention described below.

The problems with the prior art have been described with reference to (100) wafers having devices and circuit patterns oriented substantially along the cleavage planes. Similar problems are expected whenever devices are oriented substantially along the cleavage planes for other types of monocrystalline substrates including germanium, silicon, gallium arsenide, etc. regardless of crystal plane orientation of the exposed substrate surface for any of these materials. Although the cleavage planes for (100) wafers fall along the <110> directions, the cleavage planes for other types of substrates may fall along the same or different crystal directions.

SUMMARY OF THE INVENTION

In view of the foregoing, one object of the present invention is to produce a device using a sub-micron technology with less leakage failures than a device on the same size technology using the prior art methods.

Another object of the present invention is to produce a device with a wider transistor width and a longer transistor length compared to a device produced by prior art methods.

The present invention forms a device with many of its field oxide-active area edges or many of its gate electrodes oriented along the crystal directions other than the crystal directions that fall along the cleavage planes. A device formed in accordance with the present invention has less leakage failures because dislocation defects are less likely to form along the crystal directions that do not fall along the cleavage planes. If a dislocation defect forms within a (100) semiconductor wafer along a <110> crystal direction, the dislocation defect needs to be about 1.4 times longer if the device is oriented substantially along the <100> crystal directions compared to the <110> crystal directions in order to form a leaky device. Therefore, dislocation defects are less likely to form a conduction path between a source region and a drain region. In addition, the lateral diffusion rate along the <100> crystal directions is lower than the <110> crystal directions for (100) wafers. The lower diffusion rate along the <100> directions produces a device having a wider transistor width and a longer transistor length because dopants do not laterally diffuse as far compared to prior art methods. Similar results are expected for lateral oxidation rates.

An ingot of monocrystalline material is formed, shaped to be substantially cylindrical, and has at least one mark, such as a flat, to denoted a crystal direction other than a crystal direction that falls along a cleavage plane. In the case of (100) wafers, the ingot is formed so that the length of the ingot is generally perpendicular to a (100) crystal plane. The (100) crystal plane ingot is marked, preferably with a flat, to denote a <100> crystal direction of the (100) crystal plane. The (100) crystal plane ingot is lapped to form wafers with exposed surfaces generally along the (100) crystal plane. Further processing steps including edge contouring, grinding, and polishing form a wafer having a mirror-like surface.

Devices are formed on a semiconductor substrate having a monocrystalline layer. A field oxide-active area edge or a gate electrode of the device is oriented substantially along a crystal direction other than a crystal direction that falls along a cleavage planes. Preferably, a substrate having a monocrystalline silicon layer with an exposed surface lying along a (100) crystal plane has all device borders, a maximum fraction of the field oxide-active area edges, and a maximum fraction of the gate electrodes lying substantially along the <100> crystal directions of the (100) crystal plane.

In general, fewer dislocation defects and reduced lateral diffusion rates occur using the present invention. Reduced lateral oxidation rates are expected using the present invention. The present invention may be used on any monocrystalline material regardless of crystal orientation to form a diffusion junction or an oxidation edge that is oriented substantially along a crystal direction other than a crystal direction that falls along a cleavage plane. On (100) wafers, the present invention orients the diffusion junctions and oxidation edges along the <100> crystal directions. The present invention is used whenever dislocation defects, a lateral diffusion, or a lateral oxidation is to be minimized.

Other objects, features, and advantages of the present invention will be apparent from the accompanying drawings and from the detailed description that follows.

BRIEF DESCRIPTION OF THE DRAWINGS

FIG. 1 is a side view of a Czochralski grown monocrystalline silicon ingot with the length of the ingot generally perpendicular to a (100) crystal plane.

FIG. 2 is the ingot of FIG. 1 after the ingot is shaped to be generally cylindrical.

FIG. 3 is the ingot of FIG. 1 after a set of flats have been placed on the edges of the ingot in accordance with the currently preferred embodiment.

FIG. 4 is a lightly p-type doped wafer having its surface lying generally along a (100) crystal plane and flats along <110> crystal directions. (Prior art)

FIG. 5 is a lightly p-type doped wafer having its surface lying generally along a (100) crystal plane and flats along <100> crystal directions in accordance with the currently preferred embodiment.

FIG. 6 is a cross sectional view of a portion of a (100) wafer having a monocrystalline silicon layer, a pad oxide layer, and a silicon nitride layer.

FIG. 7 is the wafer of FIG. 6 after a field oxide masking pattern has been aligned along the <100> crystal direction in accordance with the currently preferred embodiment.

FIG. 8 is a top-down view of the wafer of FIG. 7 showing the relation between the patterned photoresist layer and the crystal directions of the (100) crystal plane when the masking patterned photoresist layer is aligned in accordance with the currently preferred embodiment.

FIG. 9 is the wafer of FIG. 7 after the silicon nitride layer is selectively etched.

FIG. 10 is the wafer of FIG. 9 after a field oxide layer is grown.

FIG. 11 is the wafer of FIG. 10 during post field oxidation doping steps.

FIG. 12 is the wafer of FIG. 11 after growing a gate oxide layer and forming a doped polysilicon layer.

FIG. 13 is the wafer of FIG. 12 after the polysilicon layer has been patterned in accordance with the currently preferred embodiment.

FIG. 14 is a top-down view of a portion of the wafer in FIG. 13 showing the gate electrodes and active areas formed in accordance with the currently preferred embodiment.

FIG. 15 is the wafer of FIG. 13 during the tip doping step.

FIG. 16 is the wafer of FIG. 15 during the source and drain doping step.

FIG. 17 is the wafer of FIG. 16 after the source and drain and tip dopants are activated and diffused by a heat cycle.

DETAILED DESCRIPTION OF THE PRESENT INVENTION

The methods of the present invention forms a monocrystalline semiconductor substrate having a mark oriented primarily along any crystal direction other than along a cleavage plane and forms a device made from the substrate. The device formed by the present invention is not as susceptible to leakage problems caused by dislocation defects and has a wider transistor width and a longer transistor length compared to a device oriented primarily along crystal directions that fall along the cleavage planes. Preferably, the devices are formed on (100) wafers, and the devices are oriented substantially along a <100> crystal direction of the (100) crystal plane. A <100> crystal direction is an azimuthal angle (rotational angle) of 45° from a <110> crystal direction for a (100) wafer. Circuits within the device can be more closely spaced than a device formed using prior art methods because the lateral diffusion rate and the lateral oxidation rate are less along the crystal directions that are not along cleavage planes compared to the crystal directions that are along the cleavage planes.

In the currently preferred embodiment, an ingot of monocrystalline silicon material is formed using the Czochralski growth method, so that a (100) crystal plane is generally perpendicular to the length of the ingot formed as illustrated in FIG. 1. Dopants such as boron are present within the molten silicon used to form a lightly p-type doped monocrystalline silicon ingot with a resistivity of about 35 ohm.cm. After the ingot is formed, a small portion of the ends are removed and the ingot is shaped to be generally cylindrical as shown in FIGS. 2A and 2B. The ingot is further shaped producing a primary flat along a <100> crystal direction. Because a lightly p-type doped ingot is formed, a secondary flat is placed 90° clockwise from the primary flat in accordance with Semiconductor Equipment and Materials International (SEMI) standards. Both flats extend along the length of the ingot as shown in FIG. 3A. FIG. 3B shows a side view of the ingot with the flats. FIG. 3B includes a "directional compass" of the end view to show that the flats lie substantially along the <100> crystal directions. The ingot is further processed including steps such as lapping, edge contouring, grinding, polishing, etc., to form wafers with a mirror-like surface that are used to form semiconductor devices. FIG. 4 shows a wafer formed by prior art methods having flats along the <110> crystal directions (cleavage planes). FIG. 5 is an illustration of a wafer having flats along the <100> crystal directions formed in accordance with the currently preferred embodiment.

In the currently preferred embodiment, a device is formed on the (100) wafer as previously described. The device uses a technology having its smallest dimension of about 0.6 μm. A thin silicon dioxide layer (pad oxide layer 61) about 100 Å thick and a silicon nitride layer 62 about 1500 Å thick are formed over a semiconductor substrate including a monocrystalline silicon layer 60 as depicted in FIG. 6. The first pattern formed over the substrate is a field oxide pattern, which defines where field oxide areas within the device are subsequently formed. A reticle has the field oxide pattern and alignment marks. The alignment marks allow subsequent layers to be aligned with respect to the aligning marks. The reticle also has borders of the devices and rectilinear circuit patterns within each device that are primarily oriented along the <100> crystal directions. A photoresist layer about 1 μm thick is coated over the silicon nitride layer. The reticle is aligned with respect to the primary flat that lies along a <100> crystal direction. The photoresist layer is patterned using the reticle and developed to form the photoresist member 70 in FIG. 7. The photoresist member 70 is baked to reduce photoresist erosion during subsequent processing steps.

FIG. 8 is a top-down view of the wafer after the patterned photoresist layer is formed in accordance with the currently preferred embodiment. Four devices 85 are formed on the wafer. Areas 82 and a portion of a memory array 83 are regions where field oxide is subsequently grown, and therefore, the areas 82 and those same portions of the memory array 83 are not covered with the photoresist layer. The photoresist layer covers other portions of the memory array 83, S-shaped patterns 84, and the area outside of the devices 85. For simplicity, the memory array 83 is illustrated as one area even though portions of the area either have or do not have the photoresist layer. The alignment marks are not shown in FIGS. 7 or 8. The silicon nitride layer not covered by the patterned photoresist layer 70 is etched giving a silicon nitride member 90 in FIG. 9. After the etch, the photoresist layer is removed.

The wafer is subjected to a long steam oxidation at about 950° C. for about two hours to form field oxide areas 100 about 4500 Å thick as shown in FIG. 10. The field oxide areas 100 are formed in locations where the silicon nitride member 90 is not present. The silicon nitride member 90 acts as an oxidation barrier during the steam oxidation. Near the edges of the silicon nitride member 90 is a silicon dioxide region significantly thicker than the pad oxide layer 61. These areas are called the bird's beak areas 102. An active area 103 is formed between the bird's beak areas 102. The active area 103 is surrounded by bird's beak areas 102 on all sides. The silicon nitride member 90 is removed from the wafer.

The substrate receives two sequential doping steps as shown in FIG. 11. One of the doping steps uses ion implantation to increase the field punchthrough voltage between circuits within a device. The field punchthrough implant uses B+11 ions with a dose of about $4E12$ ions/cm$^2$ and an energy of about 150 KeV. B+11 ions are boron atoms each having a single positive charge and a mass of about 11 atomic mass units. As shown in FIG. 11, most ions have sufficient energy to pass through the pad oxide layer 61. The energy of the implant produces a doping profile having the peak dose of B+11 ions within the field oxide areas 100 close to the field oxide-monocrystalline silicon layer interface. This post-field oxidation implant is about an order of magnitude less than the prior art methods that use a field punchthrough implant before field oxidation. The dopant diffusion during subsequent steps is less with the present invention because the dopant diffusion rate is a function of the dopant concentration. The field punchthrough doping may also be used to form a p-well area within another portion of the substrate. The field punchthrough implanted area 111 has a dopant profile as illustrated in FIG. 11.

The other doping step uses ion implantation to adjust the threshold voltage of the circuits within the device. The threshold adjust implant uses B+11 ions with a dose of about $1E12$ ions/cm$^2$ at an energy of about 40 KeV. FIG. 11 illustrates the implanted area 110. For simplicity, FIGS. 12-17 do not shown the field punchthrough implanted area 111, but it is nevertheless present. The threshold adjust implanted area 110 is represented by a set of "+"s in FIGS. 12-16 and a "P" under the polysilicon member 131 in FIG. 17.

The pad oxide layer 61 is removed. A sacrificial silicon dioxide layer is grown using steam, and the layer is subsequently etched using an HF solution. The sacrificial oxidation prevents the "white ribbon" effect that is related to the field oxidation steps. Both the white ribbon effect and the sacrificial oxidation are well known in the art.

A high quality gate oxide layer 120 about 150 Å thick is formed as illustrated in FIG. 12. A heavily doped polycrystalline silicon (polysilicon) layer 121 about 2000 Å thick is formed over the gate oxide layer 120. The polysilicon layer 121 is doped by ion implantation using P+31 ions at a dose of about 1E16 ions/cm$^2$ and an energy of about 40 KeV to form a highly conductive layer. The doping is generally represented by the arrows of FIG. 12.

A photoresist layer about 1 μm thick is coated over the polysilicon layer. The photoresist layer is patterned with a reticle having the polysilicon layer pattern. The reticle with the polysilicon pattern is sometimes called the gate reticle because it is used to form gate electrodes for the device. Because the gate electrodes are typically perpendicular to the field oxide-active area edges, the sides of the gate electrodes generally lie along the <100> crystal directions, too. The gate reticle is aligned with respect to the alignment marks previously formed when patterning the silicon nitride layer with the field oxide pattern reticle. After aligning, the photoresist layer is patterned using the reticle and developed to form a photoresist member. The photoresist member is baked to reduce erosion of the photoresist layer during subsequent processing steps. FIG. 13 shows a photoresist member 130. The areas of the polysilicon layer lying outside of the photoresist member 130 are etched forming a long gate electrode 131. The photoresist member 130 is removed to give a pattern as generally depicted in FIG. 14. FIG. 14 is a top-down view showing only a portion of the wafer that includes field oxide areas 100, active areas 103, and gate electrodes 131. As can be seen in FIG. 14, the gate electrodes 131 run generally perpendicular to the active areas 103.

Regions on both sides of the gate electrode 131 are ion implanted with P+31 ions at a dose of about 1E14 ions/cm$^2$ and an energy of about 50 KeV to form a source tip region 150 and a drain tip region 151 on opposing sides of the gate electrode 131 as shown in FIG. 15. A silicon dioxide layer about 3000 Å thick is deposited and etched to form sidewall spacers 160 on both sides of the gate electrode 131 in FIG. 16. The substrate is ion implanted using As+75 ions at a dose of about 3E15 ions/cm$^2$ and an energy of about 40 KeV to form a source area 161 and a drain area 162 adjacent to the sidewall spacers 160 and on opposing sides of the gate electrode 131. A heat cycle is used to activate and diffuse the dopants within the active area to produce a source area 170, a drain area 171, a source tip area 172, and a drain tip area 173 as shown in FIG. 17. Part of each tip area lies under a portion of the gate electrode 131. The distance between the tips under the gate electrode 131 is referred to as the transistor length 174. The transistor length, which is also called $L_{eff}$, is an electrically measured distance.

Additional steps form layers including a thick dielectric layer, an interconnecting layer, and a passivation layer that are used to make finished devices. These additional steps are well known in the art.

Although the currently preferred embodiment previously described has many details, one will appreciate that numerous alternate embodiments exist while not deviating from the scope or spirit of the invention. In an alternate embodiment, the ingot is formed using a float zone crystal formation process or any other process capable of forming monocrystalline substrates independent of the crystal plane that corresponds to the substrate's exposed surface. Other dopants or doping levels may be used in forming the ingot; the resistivity of the ingot changes accordingly. SEMI standards for n-type (100) wafers are indicated by primary and secondary flats on opposite sides of the wafer and preferably lie along the <100> crystal directions. In another alternative in embodiment, the primary flat may be formed along a <100> crystal direction any time after the formation of the ingot and before the placing of the first device pattern on the wafer. A notch or some other mark along the edge of the wafer may be used to denote a <100> crystal direction of a (100) wafer. Although it is preferred to have a marking along a <100> crystal direction, the benefits of the present invention are expected whenever a mark is used to denote any crystal direction that does not fall along a cleavage plane. The <100> crystal directions along the (100) crystal plane are preferred because they are halfway between the <110> crystal directions along the (100) crystal plane. Future equipment may locate the <100> crystal direction by examining the crystal lattice itself. Flats and other marks may become obsolete if crystal directions can be determined by semiconductor manufacturing equipment used in the formation of devices. The present invention may be used with substrates without any markings if the <100> crystal direction can be determined by the equipment.

Currently, wafers are the most common shape of semiconductor substrates. The present invention does not require a wafer, nor does it require the entire substrate to be solely comprised of a monocrystalline silicon material. The present invention can be utilized on any monocrystalline substrate regardless of shape. Examples include silicon-on-insulator and silicon-on-sapphire types of substrates. In addition to silicon, the principles of the present invention may be extended to other monocrystalline materials including germanium and gallium arsenide, although their use in semiconductor applications is not currently as extensive as silicon. Regardless of the substrate material or crystal orientation, the mark is used to denote a crystal direction does not fall along a cleavage plane.

The alternate embodiments used to manufacture semiconductor devices are nearly unlimited. The currently preferred embodiment describes only one such device. The present invention may be used for a device having a field isolation area that is formed by using a patterned masking area followed by the formation of the field oxide area. The present invention can be used with field isolation methods including the local oxidation of silicon (LOCOS), recessed LOCOS, trench isolation, sidewall masked isolation (SWAMI), etc.. The gate electrodes may be comprised of polycrystalline silicon, amorphous silicon, a silicide compound, or a combination thereof. It is not necessary that all field oxide-active area edges, gate electrodes, and the borders of the device all lie along the <100> crystal directions. As long as a field oxide-active area edge or a gate electrode lies along a crystal direction other than a cleavage plane (regardless of the substrate material or crystal orientation), the some or all of the benefits of the present invention may be realized. In designing a device for a (100) wafer, the design should be optimized to have the maximum fraction of field oxide-active area edges and the maximum fraction of gate electrodes lying along the <100> crystal directions because the <100> crystal directions are about halfway between the cleavage planes. Because the circuits patterns are generally rectilinear and form a rectangular device on a (100) wafer, the borders of the device should also lie substantially along the <100> crystal directions, too.

The present invention has benefits compared to the prior art including less leakage failures due to a dislocation defect. A dislocation defect is harder to form along a <100> crystal direction compared to a <110> crystal direction because the <100> direction is not along a cleavage plane. If a dislocation defect forms along a <110> crystal direction for a <100> crystal directional device, the dislocation defect must be about 1.4 times longer than the transistor length in order for the device to be leaky. The chances of a leakage failure for a device oriented primarily along a <100> crystal direction are less because a dislocation defect is harder to form and if a dislocation defect does from along a <110> crystal direction, it must be longer compared to the prior art in order to form a device with a dislocation-related leakage failure. In general, fewer device failures due to dislocation defects are expected for a device oriented along a crystal direction other than a cleavage plane compared to a device oriented along a crystal direction that falls along a cleavage plane regardless of substrate material or crystal orientation.

Unexpectedly, the dopant diffusion rate along a <100> crystal direction is less than along a <110> crystal direction. To Applicants' knowledge, no one has disclosed that lateral diffusion rates of dopants are different along a <110> crystal direction compared to a <100> crystal direction for a (100) wafer. However, it is known within the art that the vertical diffusion rates of (100), (110), and (111) wafers are different because of differences seen in the formation of shallow base devices. This decreased lateral diffusion provides a device with unexpectedly better performance. The transistor width of a device, which is also called $Z_{eff}$, is perpendicular to the transistor length and is also electrically measured. The transistor width is typically affected by the field punchthrough doping and the shape of the field oxide areas. Because the diffusion rate is less, the active area is larger because the field punchthrough doping does not diffuse as fast along the <100> crystal directions. The decreased field punchthrough doping causes the transistor width to be wider. In addition, the tip dopants below the gate electrodes do not diffuse as far, and therefore, the transistor length is longer. The tip resistance of the devices along a <100> crystal direction is lower than it is for devices formed along a <110> crystal direction. The carrier mobility of the devices also increases. The theoretical field punchthrough voltage should increase, too.

These factors tend to correlate with the finding that the dopant diffusions are reduced along a <100> crystal direction as compared to a <110> crystal direction. Therefore, dopant diffusions are dependent upon the lateral direction that the dopant moves. In general, reduced lateral diffusion rates are expected along the crystal directions other than a cleavage plane compared to the crystal directions that fall along a cleavage plane regardless of substrate material or crystal orientation.

A similar lateral effect is expected for oxidations on (100) wafers, such that the lateral oxidation rate along the <100> crystal directions is expected to be less than the lateral oxidation rate along the <110> crystal directions. The transistor width is affected by the shape of the field oxide areas as previously mentioned. The shape is typically affected by the lateral oxidation rate during when the field oxide is formed. The present invention gives a wider transistor width and a larger active area compared to the prior art methods. In general, reduced lateral oxidation rates are expected along the crystal directions other than a cleavage plane compared to the crystal directions that fall along a cleavage plane regardless of substrate material or crystal orientation.

The present invention may be used with p-channel MOS, complimentary MOS, bipolar, or hybrid bipolar-complementary MOS (BICMOS) devices. The present invention should be used whenever dislocation defects, dopant diffusion in a lateral direction, or oxidation in a lateral direction is to be minimized.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A method of forming a device on a semiconductor substrate, said device comprising a source and a drain, said method comprising the steps of:
    providing said substrate;
    doping said substrate in predetermined regions to form said source and said drain in said substrate, wherein said predetermined regions have an edge, wherein said edge is oriented along a crystal direction other than a crystal direction that falls along a cleavage plane of said substrate.

2. The method as described in claim 1 wherein said semiconductor substrate comprises silicon.

3. The method as described in claim 1 wherein a surface of said semiconductor substrate lies generally along a (100) crystal plane and wherein said edge is oriented substantially along a <100> direction of said (100) crystal plane.

4. The method as described in claim 2 wherein a surface of said semiconductor substrate lies generally along a (100) crystal plane and wherein said edge is oriented substantially along a <100> direction of said (100) crystal plane.

5. A method of forming a device on a semiconductor substrate, said device comprising a source and a drain, said method comprising the steps of:
    providing said substrate;
    forming a patterning layer, said patterning layer covering a first region of said substrate and exposing a second region of said substrate, wherein said second region defines a field oxide region, wherein said second region has an edge, wherein said edge is oriented along a crystal direction other than a crystal direction that falls along a cleavage plane of said substrate; and,
    forming said field oxide in said second region.

6. The method as described in claim 5 further comprising the steps of:
    removing said patterning layer; and,
    doping said substrate in predetermined portions of said first region to form said source and said drain in said substrate, wherein said source and said drain are oriented substantially along said edge.

7. The method as described in claim 5 wherein said semiconductor substrate comprises silicon.

8. The method as described in claim 6 wherein said semiconductor substrate comprises silicon.

9. The method as described in claim 5 wherein a surface of said semiconductor substrate lies generally along a (100) crystal plane and wherein said edge is oriented substantially along a <100> direction of said (100) crystal plane.

10. The method as described in claim 6 wherein a surface of said semiconductor substrate lies generally along a (100) crystal plane and wherein said edge is oriented substantially along a <100> direction of said (100) crystal plane.

11. The method as described in claim 7 wherein a surface of said semiconductor substrate lies generally along a (100) crystal plane and wherein said edge is oriented substantially along a <100> direction of said (100) crystal plane.

12. The method as described in claim 8 wherein a surface of said semiconductor substrate lies generally along a (100) crystal plane and wherein said edge is oriented substantially along a <100> direction of said (100) crystal plane.

* * * * *